United States Patent
Suzuki

(10) Patent No.: US 10,705,476 B2
(45) Date of Patent: Jul. 7, 2020

(54) PLURALITY OF BOARDS MOUNTED ON IMAGE FORMING APPARATUS

(71) Applicant: CANON KABUSHIKI KAISHA, Tokyo (JP)

(72) Inventor: Tatsuya Suzuki, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 16/410,951

(22) Filed: May 13, 2019

(65) Prior Publication Data
US 2019/0361382 A1 Nov. 28, 2019

(30) Foreign Application Priority Data
May 24, 2018 (JP) .................. 2018-099797

(51) Int. Cl.
| | |
|---|---|
| G03G 15/00 | (2006.01) |
| H01R 12/52 | (2011.01) |
| H05K 1/14 | (2006.01) |
| G03G 15/20 | (2006.01) |
| H05K 1/18 | (2006.01) |

(52) U.S. Cl.
CPC ......... *G03G 15/80* (2013.01); *G03G 15/2053* (2013.01); *H01R 12/52* (2013.01); *H05K 1/14* (2013.01); *H05K 1/181* (2013.01); *H05K 2201/10189* (2013.01); *H05K 2201/10303* (2013.01)

(58) Field of Classification Search
CPC .... G03G 15/80; G03G 15/2053; H01R 12/52; H05K 1/14; H05K 1/181; H05K 1/182; H05K 2201/10189; H05K 2201/10295; H05K 2201/10303; H05K 2201/1031; H05K 3/341; H05K 3/3447
See application file for complete search history.

(56) References Cited

U.S. PATENT DOCUMENTS

| | | | | |
|---|---|---|---|---|
| 3,541,225 | A * | 11/1970 | Raciti | H05K 3/3447 174/74 R |
| 4,899,182 | A * | 2/1990 | Inoue | G03G 15/50 346/145 |
| 5,008,656 | A * | 4/1991 | Cheriff | H05K 1/112 345/206 |
| 2002/0060906 | A1 * | 5/2002 | Akiba | H05K 3/368 361/803 |
| 2004/0096229 | A1 * | 5/2004 | Yoshihara | H05K 7/20145 399/33 |

(Continued)

FOREIGN PATENT DOCUMENTS

JP 2005-026245 1/2005

*Primary Examiner* — Francis C Gray
(74) *Attorney, Agent, or Firm* — Venable LLP

(57) ABSTRACT

A first connector is soldered to a first board. A second connector is soldered to a second board. A third connector and a fourth connector are soldered to a relay board. The third connector is connected to the first connector via a first power line. The fourth connector is connected to the second connector via a second power line. A surface to which the first connector is soldered on the first board is opposite to a surface to which the first connector is attached on the first board. A surface to which the second connector is soldered on the second board is a surface to which the second connector is attached on the second board. Only surface-mount devices are used as electronic components soldered to the second board.

14 Claims, 8 Drawing Sheets

(56) References Cited

U.S. PATENT DOCUMENTS

| | | | |
|---|---|---|---|
| 2006/0035492 A1* | 2/2006 | Sekido | H01R 13/112 439/100 |
| 2010/0020580 A1* | 1/2010 | Kim | G03G 15/80 363/125 |
| 2012/0038937 A1* | 2/2012 | Son | G03G 15/80 358/1.1 |
| 2014/0086611 A1* | 3/2014 | Nakagawa | G03G 15/80 399/88 |
| 2014/0219668 A1* | 8/2014 | Mine | G03G 15/5004 399/21 |
| 2017/0261901 A1* | 9/2017 | Ikeda | G03G 15/5004 |

* cited by examiner

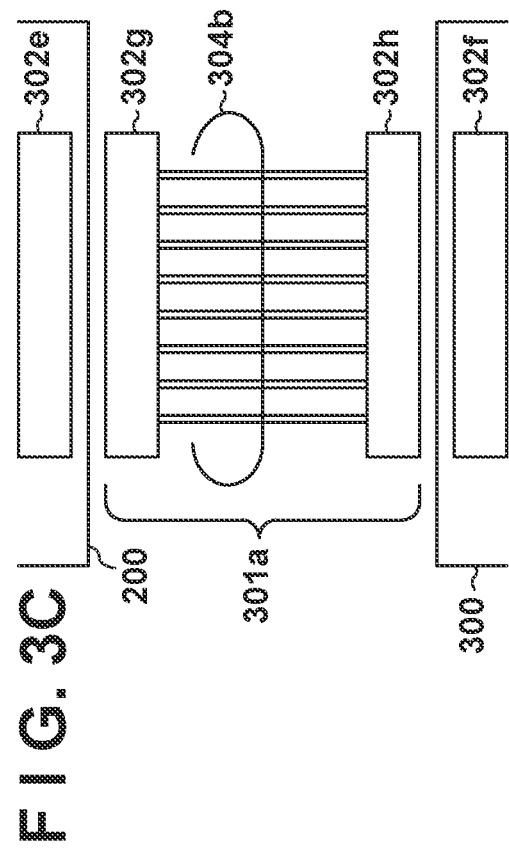
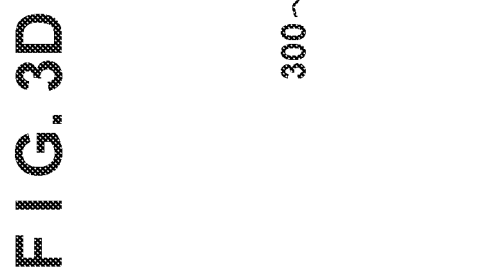
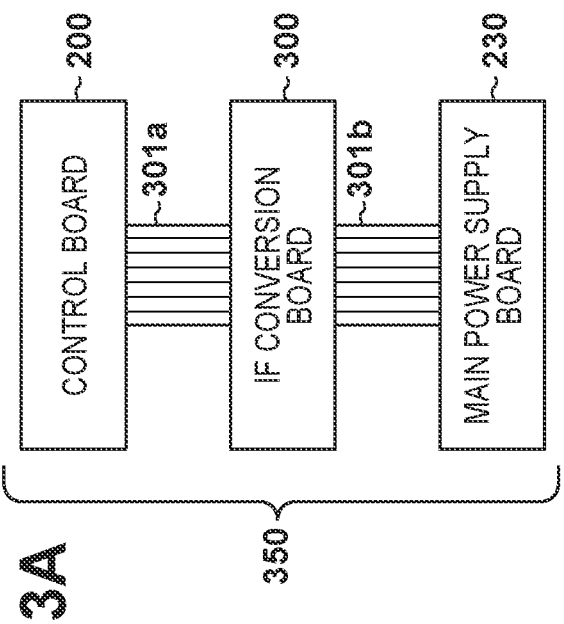
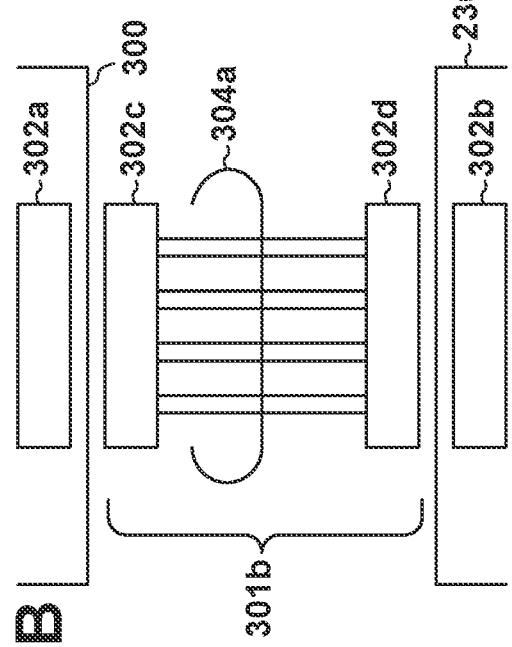

F I G. 4A
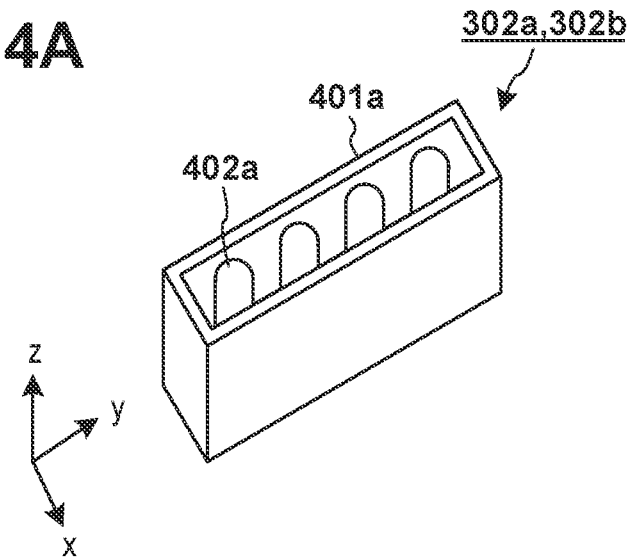
F I G. 4B
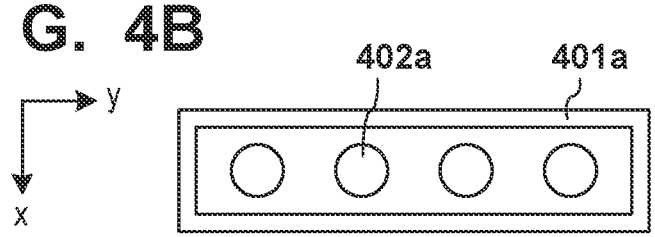
F I G. 4C
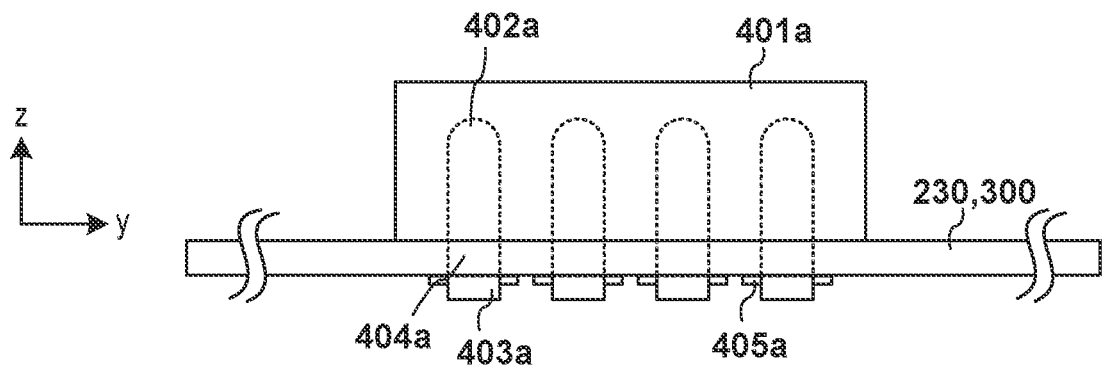

PLURALITY OF BOARDS MOUNTED ON IMAGE FORMING APPARATUS

BACKGROUND OF THE INVENTION

Field of the Invention

The present invention relates to a plurality of boards mounted on an image forming apparatus.

Description of the Related Art

An image forming apparatus includes many loads that are driven to form an image on a sheet P. The loads of the image forming apparatus include, for example, a motor that drives photosensitive drums, a high-voltage power supply that generates a voltage to be applied to charging devices or developing devices, and a heater of a fixing device. In recent years, provision of a power supply board that generates a voltage to be supplied to these loads and a control board that controls the loads as separate boards has been considered. In this configuration, a connector provided on the control board and a connector provided on the power supply board are connected by cables such as a wire harness.

Japanese Patent Laid-Open No. 2005-26245 suggests mounting of a surface-mount-type connector and a DIP-type connector on a single circuit board. A DIP-type connector denotes a connector in which a connector lead is inserted through a through-hole provided on a circuit board and the lead is soldered to a back surface of the circuit board. A surface-mount-type connector denotes a connector in which a connector lead is soldered to a land provided on a front surface of the circuit board.

A DIP-type electronic component is attached to a board using a flow mounting method. The flow mounting method is a method whereby an electronic component is soldered to a board by producing an upwelling of liquid solder. On the other hand, a surface-mount-type electronic component is attached to a board using a reflow mounting method. The reflow mounting method is a method whereby an electronic component is soldered to a board by applying cream-like solder between the board and the electronic component and heating the board in a reflow oven.

In the meantime, in a case where a DIP-type electronic component and a surface-mount-type electronic component are attached to one board, a flow mounting method and a reflow mounting method need to be implemented with respect to this board. Therefore, a board to which both of a DIP-type electronic component and a surface-mount-type electronic component are attached has a high manufacturing cost.

SUMMARY OF THE INVENTION

The present application provides an image forming apparatus comprising the following elements. An image forming unit is configured to form an image on a sheet. A fixing unit includes a heater, and is configured to fix the image on the sheet. A first board includes a power supply circuit that generates a predetermined direct-current voltage from an alternating-current voltage supplied from a commercial alternating-current power supply. The power supply circuit is configured to apply the alternating-current voltage to the heater. A second board is configured to control the image forming unit based on the predetermined direct-current voltage generated by the power supply circuit. A first connector is soldered to the first board. A second connector is soldered to the second board. A relay board to which a third connector and a fourth connector are soldered. The third connector is connected to the first connector of the first board via a first power line. The fourth connector is connected to the second connector of the second board via a second power line. A surface to which the first connector is soldered on the first board is opposite to a surface to which the first connector is attached on the first board. A surface to which the second connector is soldered on the second board is a surface to which the second connector is attached on the second board. Only surface-mount devices are used as electronic components soldered to the second board, including the second connector. The number of pins in the second connector is larger than the number of pins in the first connector. The number of pins in the fourth connector is larger than the number of pins in the third connector. The predetermined direct-current voltage generated by the power supply circuit is supplied to the second board by way of the relay board.

Further features of the present invention will become apparent from the following description of exemplary embodiments with reference to the attached drawings.

BRIEF DESCRIPTION OF THE DRAWINGS

FIGS. 3A to 3D are block diagrams showing the circuit board assembly.

FIGS. 4A to 4C are diagrams for describing a mode for mounting a DIP-type connector.

DESCRIPTION OF THE EMBODIMENTS

[Image Forming Apparatus]

Figure 1:
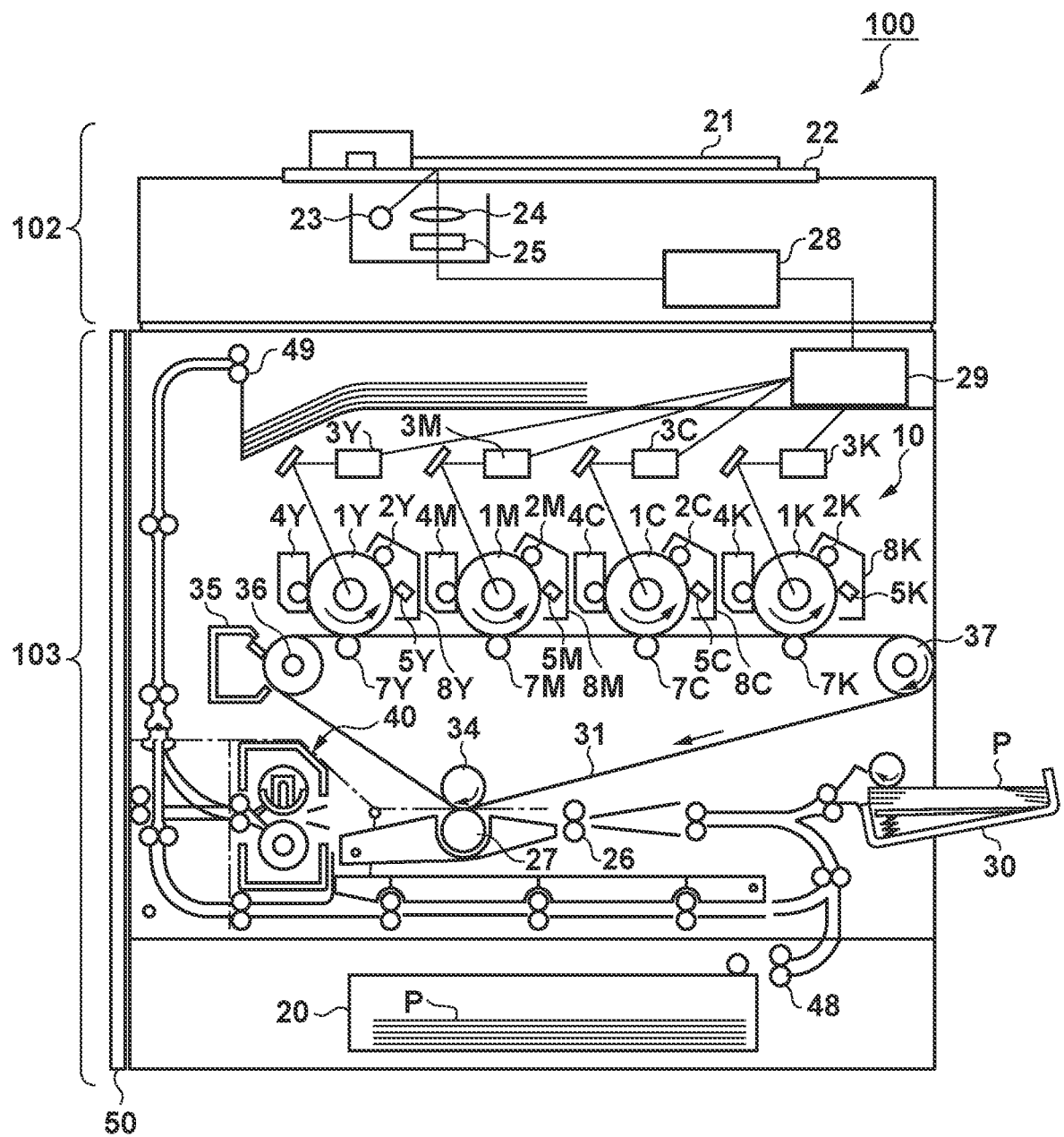
FIG. 1 is a schematic cross-sectional diagram showing an image forming apparatus.

FIG. 1 is a cross-sectional view showing an image forming apparatus 100. The image forming apparatus 100 includes an image reader 102 and a printer 103. The image reader 102 is a reading unit that reads an original. A light source 23 irradiates an original 21 placed on a glass platen 22 with light. An optical system 24 directs reflected light from the original 21 to a CCD sensor 25 to form an image. CCD is an abbreviation for a charge-coupled device. The CCD sensor 25 includes red, green, and blue line sensors, and generates color component signals corresponding to red, green, and blue. An image processing unit 28 executes image processing (e.g., shading correction) with respect to image data obtained by the CCD sensor 25, and outputs the resultant image data to a printer control unit 29 of the printer 103.

An image forming unit 10 of the printer 103 is an image forming engine of an electrophotographic type, which forms toner images corresponding to image data on a sheet P. The image forming unit 10 includes four stations that respectively form toner images of colors Y (yellow), M (magenta), C (cyan), and K (black). Note that the present invention is also applicable to a monochrome printer that forms a single-color image. As shown in FIG. 1, the image forming unit 10 includes four photosensitive drums 1 that respectively correspond to the colors in order from left. The letters Y, M, C, and K appended to reference numerals indicate toner colors, but they are omitted in the explanation of matters that are common to the four colors. A charging device 2, an exposure device 3, a developing device 4, a primary transfer device 7, a drum cleaner 5, and the like are disposed around each photosensitive drum 1. Here, the photosensitive drum 1, the charging device 2, and the drum cleaner 5 are integrated as a process cartridge 8. The process cartridge 8 is attachable to and removable from the image forming apparatus 100. Furthermore, the image forming apparatus 100 includes an intermediate transfer belt 31 on which toner images are formed, a secondary transfer device 27 that transfers the toner images on the intermediate transfer belt 31 to a sheet P, and a fixing device 40 that fixes the toner images on the sheet P. Note that the intermediate transfer belt 31 is wound around three rollers 34, 36, 37, and rotates in a predetermined direction as the roller 37 rotates in a direction of an arrow. The intermediate transfer belt 31 is provided with a belt cleaner 35.

Configurations of the units of the image forming apparatus 100 will now be described. The photosensitive drums 1 are aluminum cylinders with a photosensitive layer formed on a surface thereof. The photosensitive drums 1 function as photosensitive members. The charging devices 2 include, for example, a metallic wire, a charging roller, or a charging brush to which a charging voltage is supplied. The exposure devices 3 may be configured to include a light source 310 that emits laser light (FIG. 7) and a rotatable polygon mirror that deflects laser light from the light source 310. Alternatively, the exposure devices 3 may be configured in such a manner that a plurality of light sources 310 that emit laser light are aligned in a direction of axial lines of the photosensitive drums 1. The direction of axial lines denotes a direction parallel to rotation axes of the photosensitive drums 1. Laser light from the exposure devices 3 scan the photosensitive drums 1. The developing devices 4 house developer (toner). The developing devices 4 include a developing roller for supplying the developer to the photosensitive drums 1. The developer is carried on a surface of the developing roller due to a magnet provided inside the developing roller. Note that, although the developer described in the present embodiment is assumed to be two-component developer including non-magnetic toner and magnetic carrier, the developer may be, for example, single-component developer composed of magnetic toner. The primary transfer devices 7 are, for example, transfer rollers or transfer blades to which a primary transfer voltage is supplied. The primary transfer devices 7 press the intermediate transfer belt 31 against the photosensitive drums 1, thereby forming nip portions (primary transfer nip portions) between the photosensitive drums 1 and the intermediate transfer belt 31. The drum cleaners 5 are, for example, cleaning blades made of an elastic material that comes into contact with the surfaces of the photosensitive drums 1, or fur brushes that collect toner by coming into contact with the surfaces of the photosensitive drums 1. The secondary transfer device 27 is, for example, a transfer roller to which a secondary transfer voltage is supplied, or a transfer belt wound around a plurality of rollers. The secondary transfer device 27 presses the intermediate transfer belt 31, thereby forming a nip portion (secondary transfer nip portion) between the intermediate transfer belt 31 and the secondary transfer device 27. The belt cleaner 35 is, for example, a cleaning blade that comes into contact with a surface of the intermediate transfer belt 31, or a fur brush that comes into contact with the surface of the intermediate transfer belt 31.

Below, a procedure for forming a black toner image will be described as a representative for the four colors. Note that, as a procedure for forming toner images of other colors is similar to the procedure for forming a black toner image, its detailed explanation will be omitted. When image formation has been started, the photosensitive drum 1 rotates in a predetermined direction (a direction of an arrow). The charging device 2 charges the surface of the photosensitive drum 1. The exposure device 3 exposes the surface of the photosensitive drum 1 based on image data output from the printer control unit 29. As a result, an electrostatic latent image is formed on the photosensitive drum 1. The developing device 4 develops the electrostatic latent image using toner. Through the above-described process, a toner image is formed on the photosensitive drum 1. Using the primary transfer voltage, the primary transfer device 7 transfers the toner image carried on the photosensitive drum 1 to the intermediate transfer belt 31. The drum cleaner 5 removes toner that is left on the photosensitive drum 1 without getting transferred to the intermediate transfer belt 31 at the primary transfer nip portion.

A feeding cassette 20 houses sheets P. Sheets P are placed in a multi-feeding tray 30. A sheet P fed from the feeding cassette 20 or the multi-feeding tray 30 is transported toward a pair of registration rollers 26. The pair of registration rollers 26 temporarily stops the sheet P fed from the feeding cassette 20 or the multi-feeding tray 30, and transports the sheet P to the secondary transfer nip portion so that the toner image on the intermediate transfer belt 31 is transferred to a desired position on the sheet P. While the sheet P is passing through the secondary transfer nip portion, the secondary transfer voltage is applied to the secondary transfer device 27. As a result, the secondary transfer device 27 secondary-transfers the toner image on the intermediate transfer belt 31 to the sheet P. Note that the belt cleaner 35 removes toner that is left on the intermediate transfer belt 31 without getting transferred to the sheet P at the secondary transfer nip portion. The sheet P to which the toner image has been transferred is transported to the fixing device 40. The fixing device 40 fixes the toner image on the sheet P.

A door 50 is a door used in maintenance. When a sheet is jammed, a user or a person in charge of maintenance opens the door 50 and removes the sheet.

[Electrical Components That Compose Image Forming Apparatus]

Figure 2:
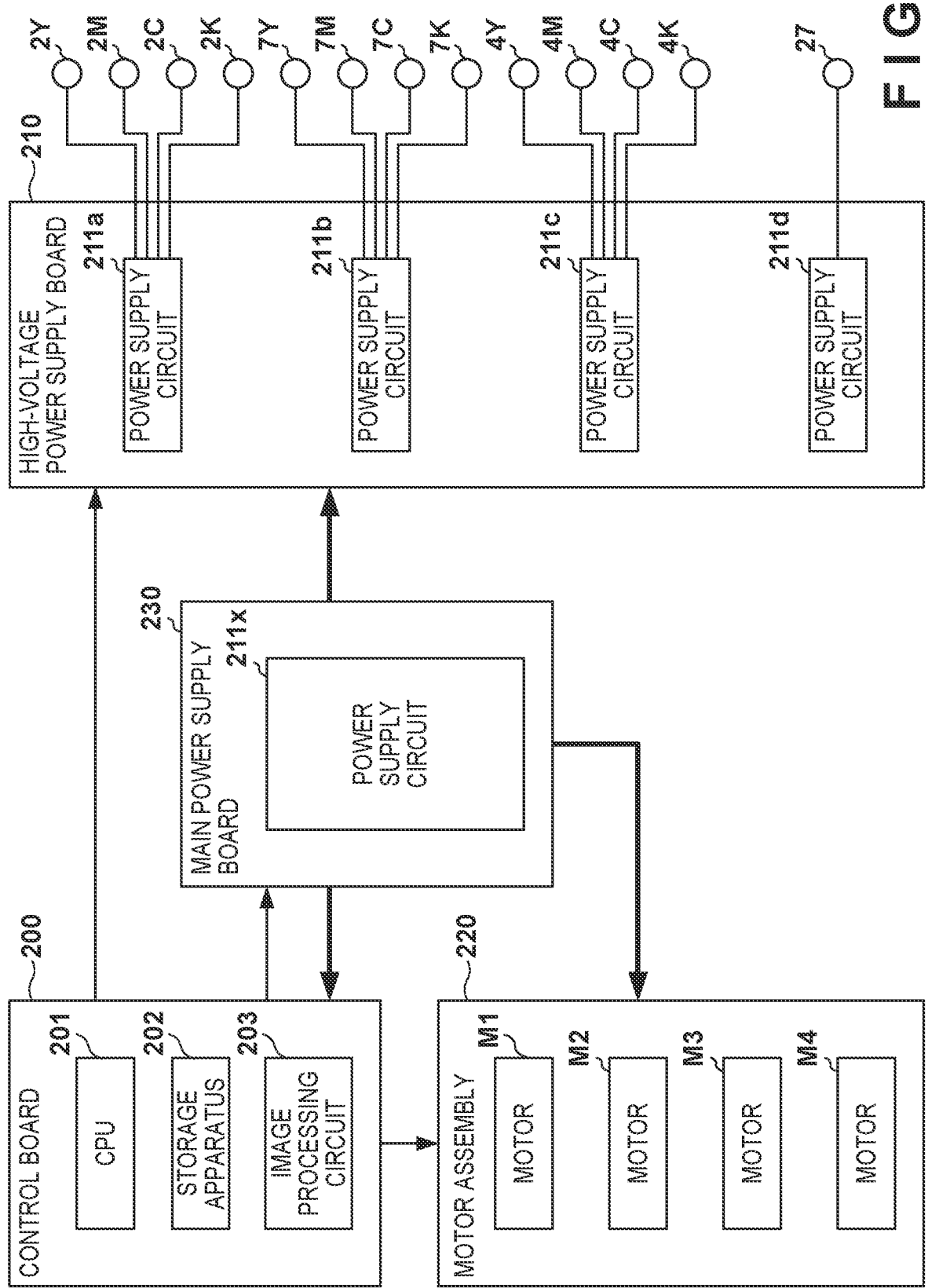
FIG. 2 is a block diagram showing a circuit board assembly.

FIG. 2 shows electrical components that compose a part of the printer control unit 29. A control board 200 is a circuit board assembly composed of one or a plurality of printed boards. A CPU 201, a storage apparatus 202, and an image processing circuit 203 are mounted on the control board 200. The storage apparatus 202 and the image processing circuit 203 are connected to the CPU 201 via a communication bus. The CPU 201 executes control programs stored in the storage apparatus 202, and controls a main power supply board 230, a high-voltage power supply board 210, a motor assembly 220, and the like in accordance with the control programs. The storage apparatus 202 includes memories, such as a ROM and a RAM. The image processing circuit 203 executes, for example, tone correction control to control tones of an output image. The tone correction control is processing for converting image signal values included in image data based on a tone correction table.

The motor assembly 220 is a collection of various motors that are driven in accordance with a drive signal (control signal) output from the CPU 201. A motor M1 drives a feeding roller 48. A motor M2 is a motor that drives the pair of registration rollers 26. A motor M3 is a motor that drives a fixing roller provided in the fixing device 40. A motor M4 is a motor that drives a pair of discharge rollers 49.

The main power supply board 230 includes a power supply circuit 211x that convers an alternating-current voltage supplied from a commercial alternating-current power supply into various levels of direct-current voltages (e.g., 3.3 V, 5 V, 12V, and 24V). The main power supply board 230 supplies a direct-current voltage to the control board 200, supplies a direct-current voltage to the motor assembly 220, and supplies a direct-current voltage to the high-voltage power supply board 210.

The high-voltage power supply board 210 includes a plurality of power supply circuits that convert the direct-current voltage supplied from the main power supply board 230 into various levels of direct-current voltages (e.g., a high voltage of several hundred volts) and alternating-current voltages. A power supply circuit 211a generates a charging voltage and supplies the charging voltage to the charging devices 2. A power supply circuit 211b generates a primary transfer voltage and supplies the primary transfer voltage to the primary transfer devices 7. A power supply circuit 211c generates a developing voltage and supplies the developing voltage to the developing devices 4. A power supply circuit 211d generates a secondary transfer voltage and supplies the secondary transfer voltage to the secondary transfer device 27. The CPU 201 supplies, to the power supply circuits 211a to 211d, signals of instructions on voltage values and signals of instructions on starting and stopping the voltage output.

[Mode of Inter-Board Connection]

FIG. 3A shows a mode of connection between a plurality of printed circuit boards that compose a circuit board assembly 350. A first harness unit 301a is a wire harness connecting the control board 200 and an IF conversion board 300. IF is an abbreviation for an interface. A second harness unit 301b is a wire harness connecting the IF conversion board 300 and the main power supply board 230. The IF conversion board 300 is a printed board for absorbing the difference between an interface on the control board 200 side and an interface on the main power supply board 230 side.

FIG. 3B shows the second harness unit 301b. The second harness unit 301b includes n cables 304a, a connector 302c provided at one end of the cables 304a, and a connector 302d provided at the other end of the cables 304a. In the present example, n is four. Among the cables 304a, two cables are power supply lines, and the other two cables are grounding lines. Each of the connectors 302c, 302d has n conductive pins. Each of the n conductive pins is electrically connected to one of the n cables 304a. The connector 302c fits into and is electrically connected to a connector 302a provided on the IF conversion board 300. The connector 302c is a plug. The connector 302a is a receptacle. The connector 302d fits into and is electrically connected to a connector 302b provided on the main power supply board 230. The connector 302d is a plug. The connector 302b is a receptacle.

The main power supply board 230 supplies power to all electrical loads that compose the image forming apparatus 100, including the control board 200, the motor assembly 220, the high-voltage power supply board 210, and the like. A current that can be output from the main power supply board 230 may be, for example, approximately 20 A. Therefore, DIP-type electrical components that can withstand a high current are used as electrical components mounted on the main power supply board 230. That is, the connector 302b is a DIP-type connector. Various DIP-type electrical components, including the connector 302b, are mounted on a first surface of the main power supply board 230. A lead of the connector 302b is inserted into a through-hole that penetrates the board from the first surface to a second surface. A land is provided on the second surface of the main power supply board 230. The lead of the connector 302b is soldered to this land using a flow mounting method. In the flow mounting method, the second surface comes into contact with a solder pool housing molten solder, thereby soldering the lead and the land together. That is, the surface to which the connector 302b is soldered is opposite to the surface to which the connector 302b is attached.

The connector 302a mounted on a first surface of the IF conversion board 300 also needs to be a DIP-type connector that can withstand a high current. This is because a high current flows from the main power supply board 230 to the connector 302a via the second harness unit 301b. A lead of the connector 302a is inserted into a through-hole that penetrates the IF conversion board 300 from the first surface to a second surface of the board. A land is provided on the second surface of the IF conversion board 300. The lead of the connector 302a is soldered to this land using the flow mounting method. That is, the surface to which the connector 302a is soldered is opposite to the surface to which the connector 302a is attached. Note that a current of 10 A can flow through one pin in the connector 302a. Also note that it is sufficient for a current that flows through one pin in the connector 302a to be higher than 6 [A].

FIG. 3C shows the first harness unit 301a. The first harness unit 301a electrically connects the IF conversion board 300 and the control board 200. The first harness unit 301a includes m cables 304b, a connector 302g provided at one end of the cables 304b, and a connector 302h provided at the other end of the cables 304b. In the present example, m is eight. Among the cables 304b, four cables are power supply lines, and the other four cables are grounding lines. Each of the connectors 302g, 302h has m conductive pins. Each of the m conductive pins is electrically connected to one of the m cables 304b. The connector 302h fits into and is electrically connected to a connector 302f provided on the IF conversion board 300. The connector 302h is a plug. The connector 302f is a receptacle. The connector 302g fits into and is electrically connected to a connector 302e provided on the control board 200. The connector 302g is a plug. The connector 302e is a receptacle.

As the connector 302a provided on the IF conversion board 300 is a DIP-type connector as stated earlier, the connector 302f may be a DIP-type connector as well. By using DIP-type connectors as both of the connectors 302a, 302f, a mounting cost is reduced. However, the connector 302f may be a surface-mount-type connector.

Incidentally, all of the electrical components mounted on the control board 200 are surface-mount-type electrical components in view of reduction of a board area, reduction of cost, and the manufacturing quality. Therefore, a surface-mount-type connector is used also as the connector 302e. Here, it is assumed that a current of 5 A can flow through one pin in a surface-mount-type connector.

As described above, the control board 200 is composed of surface-mount-type electrical components (surface-mount devices). Therefore, a land and a lead of an electrical component, which are provided on a mount surface of the control board 200, are soldered together using a reflow mounting method. In the reflow mounting method, the land and the lead are soldered together by thermal melting of a solder paste applied to the land. That is, the surface to which the surface-mount devices are soldered is the same as the surface to which the surface-mount devices are attached.

FIG. 3D is a diagram for describing the IF conversion board 300. The number of pins in the connector 302b of the main power supply board 230 is different from the number of pins in the connector 302e of the control board 200. Furthermore, the amount of current that can flow through one pin in the connector 302b of the main power supply board 230 is different from the amount of current that can flow through one pin in the connector 302e of the control board 200. That is, an interface of the main power supply board 230 is different from an interface of the control board 200. For this reason, the IF conversion board 300 is suggested in the present embodiment.

As shown in FIG. 3D, the IF conversion board 300 includes conductive wiring patterns 305 that connect the connector 302a and the connector 302f. To electrically connect one pin in the connector 302a and two pins in the connector 302f, the wiring patterns 305 branch out from one into two. This resolves the problem of the difference in the amount of current that can flow through each pin.

[DIP-Type Connector]

FIG. 4A is a perspective view showing the DIP-type connectors 302a, 302b. FIG. 4B is a plan view of the DIP-type connectors 302a, 302b. FIG. 4C is a side view of the DIP-type connectors 302a, 302b. The connectors 302a, 302b include a connector case 401a made of resin (an insulating member), connector pins 402a as conductive members, and connector leads 403a as conductive members. The connector leads 403a may be parts of the connector pins 402a. The connector leads 403a and the connector pins 402a may be electrically connected via conductive members.

The IF conversion board 300, on which the connector 302a is mounted, is provided with through-holes 404a that penetrate the board from the first surface (the surface on which components are mounted) to the second surface. The connector pins 402a of the connector 302a are inserted through the through-holes 404a from the first surface side of the IF conversion board 300. Lands 405a are provided on the second surface of the IF conversion board 300. The connector leads 403a that project on the second surface via the through-holes 404a are soldered to the lands 405a using the flow mounting method.

The main power supply board 230, on which the connector 302b is mounted, is provided with through-holes 404a that penetrate the board from the first surface to the second surface. The connector pins 402a of the connector 302b are inserted through the through-holes 404a from the first surface side of the main power supply board 230. Lands 405a are provided on the second surface of the main power supply board 230. The connector leads 403a that project on the second surface via the through-holes 404a are soldered to the lands 405a using the flow mounting method.

Figure 5A:
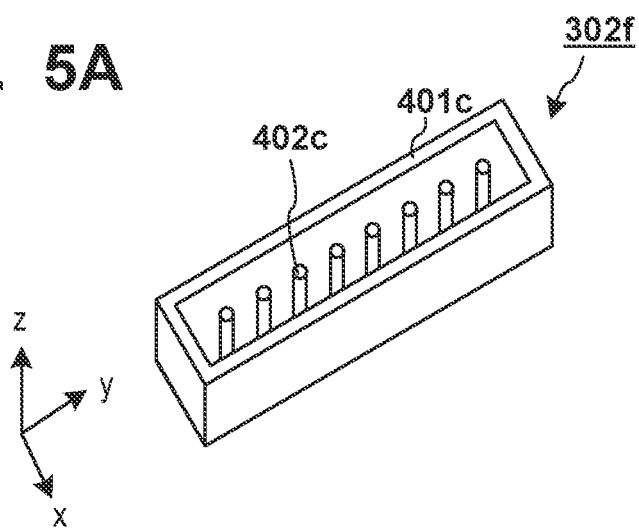
FIGS. 5A to 5C are diagrams for describing a mode for mounting a DIP-type connector.
Figure 5B:
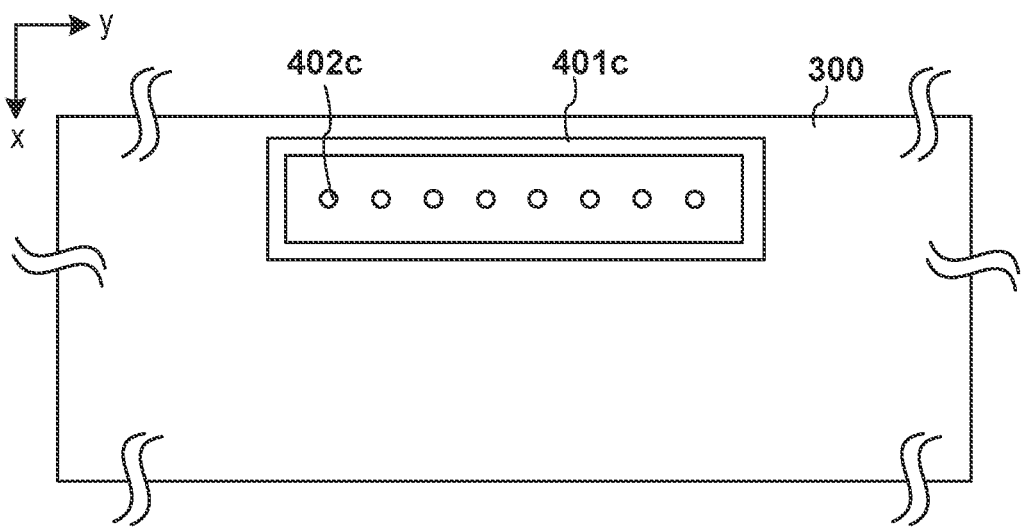
Figure 5C:
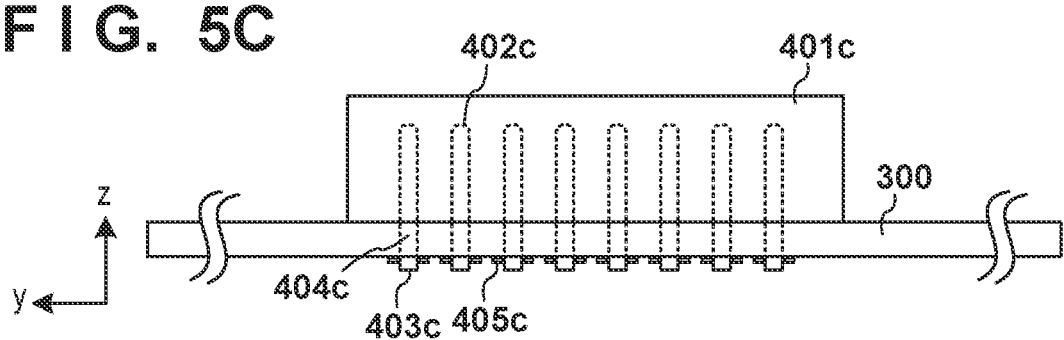

FIG. 5A is a perspective view showing the DIP-type connector 302f. FIG. 5B is a plan view of the DIP-type connector 302f. FIG. 5C is a side view of the DIP-type connector 302f. The connector 302f includes a connector case 401c made of resin (an insulating member), connector pins 402c as conductive members, and connector leads 403c as conductive members. The connector leads 403c may be parts of the connector pins 402c. The connector leads 403c and the connector pins 402c may be electrically connected via conductive members.

The IF conversion board 300, on which the connector 302f is mounted, is provided with through-holes 404c that penetrate the board from the first surface (the surface on which components are mounted) to the second surface. The connector pins 402c of the connector 302c are inserted through the through-holes 404c from the first surface side of the IF conversion board 300. Lands 405c are provided on the second surface of the IF conversion board 300. The connector leads 403c that project on the second surface via the through-holes 404c are soldered to the lands 405c using the flow mounting method. That is, the surface to which the connector 302f is soldered is opposite to the surface to which the connector 302f is attached.

[Surface-Mount-Type Connector]

Figure 6A:
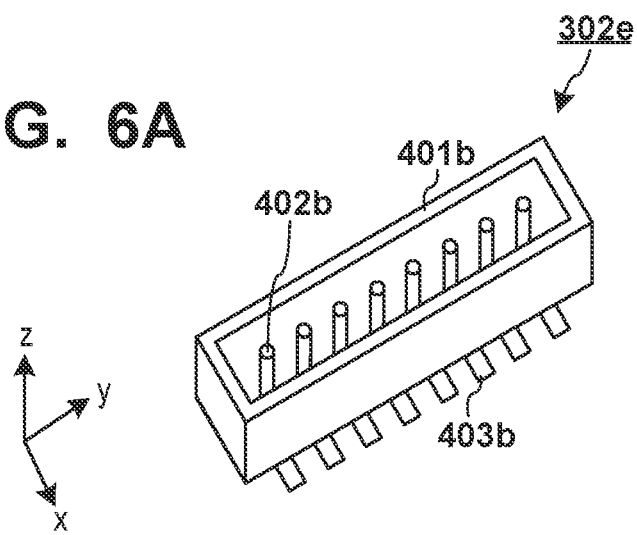
FIGS. 6A to 6C are diagrams for describing a mode for mounting a surface-mount-type connector.
Figure 6B:
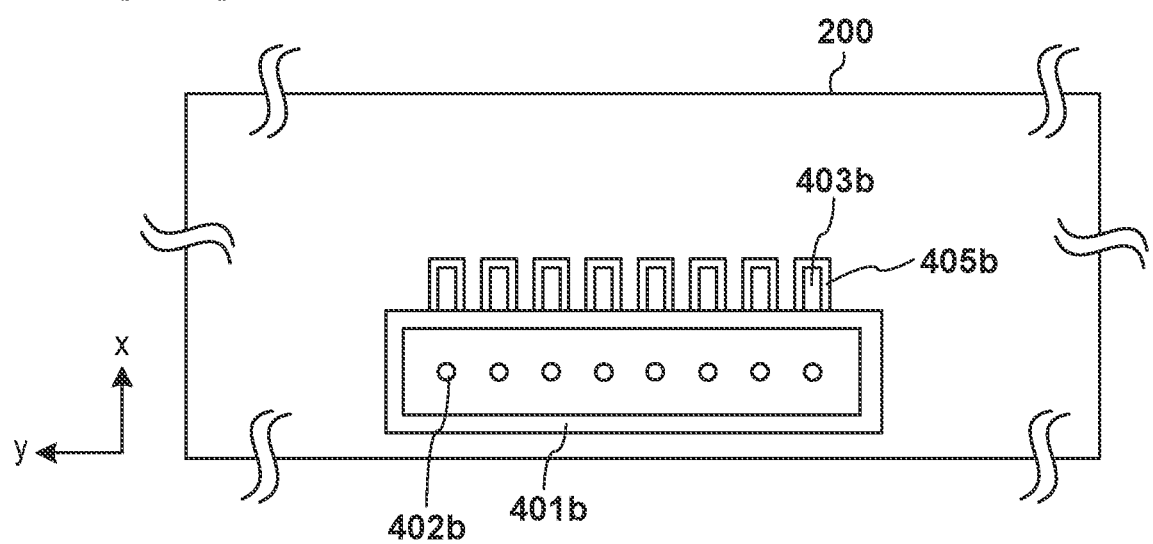
Figure 6C:
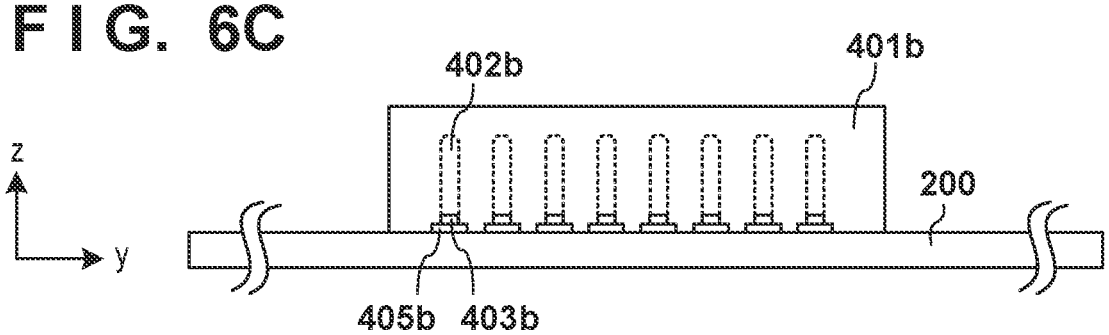

FIG. 6A is a perspective view showing the surface-mount connector 302e. FIG. 6B is a plan view of the surface-mount connector 302e. FIG. 6C is a side view of the surface-mount connector 302e. The connector 302e includes a connector case 401b made of resin (an insulating member), connector pins 402b as conductive members, and connector leads 403b as conductive members. The connector leads 403b may be parts of the connector pins 402b. The connector leads 403b and the connector pins 402b may be electrically connected via conductive members. The connector leads 403b extend from a bottom surface or a side surface of the connector case 401b to a side of the connector case 401b (in an x direction).

Lands 405b are provided on a first surface (a surface on which components are mounted) of the control board 200 on which the connector 302e is mounted. The connector leads 403b are soldered to the lands 405b using the reflow mounting method. That is, a solder paste is printed on the lands 405b, the connector leads 403b are placed on the solder paste, the solder paste is melted by applying heat to the solder paste, and the connector leads 403b are joined to the lands 405b by soldering. Note that the DIP-type connector 302f may be replaced by the connector 302e. In this case, the lands 405b are provided on the first surface of the IF conversion board 300.

[Circuit Diagram]

Figure 7:
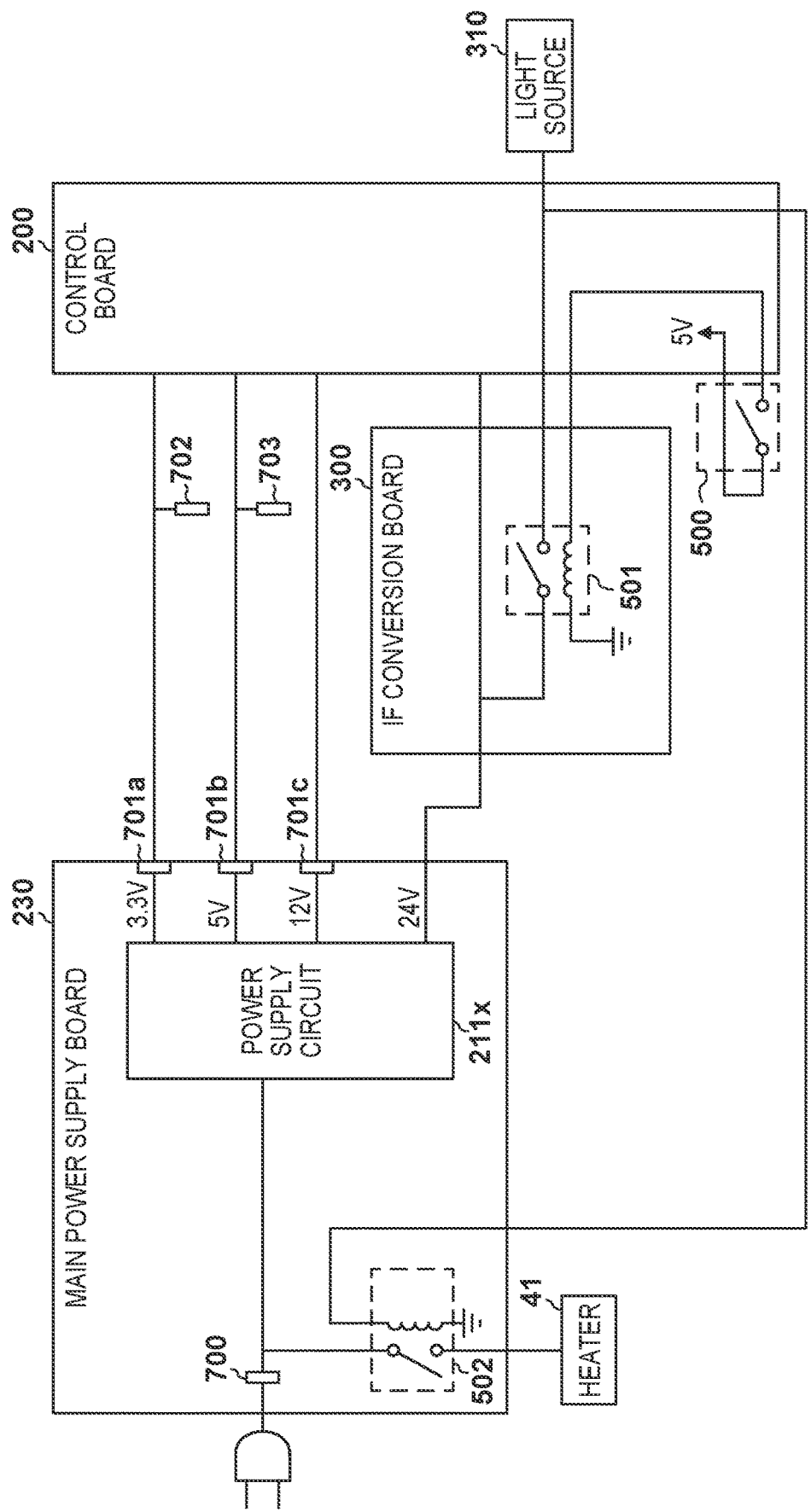
FIG. 7 is a circuit diagram of a control board, a main power supply board, and an IF conversion board according to the present embodiment.

FIG. 7 shows a part of a circuit diagram of the control board 200, the main power supply board 230, and the IF conversion board 300. An alternating-current voltage is applied from the commercial alternating-current power supply to the main power supply board 230. The main power supply board 230 further applies the alternating-current voltage supplied from the commercial alternating-current power supply to a heater 41 of the fixing device 40. That is, the alternating-current voltage is applied to the heater 41 via the main power supply board 230.

The alternating-current voltage supplied from the commercial alternating-current power supply is supplied to the power supply circuit 211x included in the main power supply board 230 via a filter 700. Then, the power supply circuit 211x generates predetermined direct-current voltages from the alternating-current voltage. Here, the power supply circuit 211x according to the present embodiment generates direct-current voltages of 3.3 V, 5 V, 12 V, and 24 V.

The direct-current voltages of 3.3 V, 5 V, and 12 V are supplied to the control board 200 via, for example, connectors 701a to 701c. The direct-current voltage of 3.3 V is applied to, for example, a sensor 702 provided in the image forming apparatus 100. The direct-current voltage of 5 V is applied to, for example, a photointerrupter 703 provided in the image forming apparatus 100. The direct-current voltage of 12 V is applied to, for example, a fan provided in the image forming apparatus 100.

On the other hand, the direct-current voltage of 24 V is supplied to the control board 200 via the IF conversion board 300. The control board 200 supplies the direct-current voltage of 24 V to the high-voltage power supply board 210 and the motor assembly 220 shown in FIG. 2. The control board 200 further supplies the direct-current voltage of 24 V to the light sources 310 of the exposure devices 3.

Furthermore, the image forming apparatus 100 has an interlock mechanism 500 that blocks power supply to the heater 41 and the light sources 310 in response to opening of the door 50. The interlock mechanism 500 is realized by a switch that mechanically opens when the door 50 of the image forming apparatus 100 is opened. The interlock mechanism 500 is electrically connected to an interlock circuit 501 of the IF conversion board 300. The interlock circuit 501 is also electrically connected to an interlock circuit 502 of the main power supply board 230.

When the switch of the interlock mechanism 500 opens, a relay of the interlock circuit 501 blocks the direct-current voltage of 24 V supplied to the light sources 310, and a relay of the interlock circuit 502 blocks the alternating-current voltage supplied to the heater 41. Accordingly, when the door 50 is opened, power supply to the loads can be stopped, even if the image forming apparatus 100 is in operation.

A description is now given of an ingenious way of using only surface-mount devices as electronic components attached to the control board 200. Assuming that the main power supply board 230 and the control board 200 are directly connected via cables, the number of pins in the connector of the control board 200 to which the cables are connected, is determined by the number of pins in the connector of the main power supply board 230. Also, the radius of pins in a surface-mount-type connector, which is a surface-mount device, is smaller than the radius of pins in a DIP-type connector. Therefore, when the number of pins in the connector of the control board 200 is limited by the number of pins in the connector of the main power supply board 230, there is a possibility that a high current flows into the pins in the connector of the control board 200, thereby damaging the pins in the connector. In view of this, in the image forming apparatus 100 according to the present embodiment, the IF conversion board 300 is electrically connected between the main power supply board 230 and the control board 200 as shown in FIG. 7.

On the IF conversion board 300, the number of pins in the connector 302f, which is connected to the control board 200 via the cables 304b, is larger than the number of pins in the connector 302a, which is connected to the main power supply board 230 via the cables 304a. That is, the IF conversion board 300 converts the number of pins in the connector 302f into the number of pins in the connector 302a. This can suppress the flow of the high current through the connector 302e of the control board 200, even when the direct-current voltage of 24 V from the main power supply board 230 is supplied to the control board 200.

All of the electronic components attached to the main power supply board 230 according to the present embodiment are DIP-type electronic components. That is, no surface-mount device is attached to the main power supply board 230 according to the present embodiment. Accordingly, the reflow mounting method can be skipped in manufacturing the main power supply board 230. Therefore, the manufacturing cost of the main power supply board 230 is reduced. Furthermore, in the case of a DIP-type connector, the area occupied by the connector can be reduced by reducing the number of pins. In this way, a degree of freedom in design is increased by downsizing the main power supply board 230 in the image forming apparatus 100 according to the present embodiment.

The following technical ideas are derived from the above-described embodiment. The main power supply board 230 is one example of a first board that applies a commercial alternating-current power source to the heater. The power supply circuit 211x is one example of a power supply circuit that generates predetermined direct-current voltages from the alternating-current voltage of the commercial alternating-current power supply. The control board 200 is one example of a second board that controls the image forming unit 10 based on the predetermined direct-current voltages generated by the power supply circuit 211x. The connector 302b is one example of a first connector soldered to the main power supply board 230. The connector 302e is one example of a second connector soldered to the control board 200. The connector 302a is one example of a third connector connected to the connector 302b via the cables 304a. The cables 304a are one example of first power lines. The connector 302f is one example of a fourth connector connected to the connector 302e via the cables 304b. The cables 304b are one example of second power lines. The IF conversion board 300 is one example of a relay board to which the connector 302a and the connector 302f are soldered. According to the present invention, as the IF conversion board 300 is provided, only surface-mount devices can be used as electronic components soldered to the control board 200.

Electronic components soldered to the first board include the first connector. These electronic components need not include a surface-mount device. Electronic components soldered to the relay board, including the third connector and the fourth connector, need not include a surface-mount device. A current that flows through one pin in the first connector may be higher than 6 [A]. Note that an electronic component for blocking the alternating-current voltage applied from the commercial alternating-current power supply to the heater may be attached to the relay board. An electronic component for blocking power supply to the light sources may be attached to the relay board. An electronic component for blocking power supply to the developing devices may be attached to the relay board. One example of these blocking functions is the interlock circuit 501.

As shown in FIG. 2, the CPU 201 and the storage apparatus 202 are examples of a CPU and a memory. These are examples of surface-mount-type electrical components mounted on a first board. A first connector mounted on the first board is a surface-mount-type connector. Therefore, the CPU and the memory are not touched by the hands of a person who performs the mounting operation, which makes it unlikely for the CPU and the memory to suffer electrostatic breakdown. As shown in FIG. 2, the power supply circuit 211x is one example of a power supply circuit mounted on a second board. As shown in FIG. 3A and the like, the power supply circuit 211x supplies power to surface-mount-type electrical components mounted on the first board via a second connector, a second harness unit, a fourth connector, wiring patterns, a third connector, a first harness unit, and the first connector. Because the power supply circuit 211x supplies a high current to the control board 200, the plurality of intervening connectors must be able to allow the high current to flow through themselves. However, a rated current value of a surface-mount-type connector is smaller than a rated current value of a DIP-type connector. In view of this, by providing an intervening third board such as the IF conversion board 300, a surface-mount-type connector can be used on the first board such as the control board 200. As shown in FIGS. 3B to 3D and the like, the number of a plurality of connector pins provided in the third connector may be m. The number of a plurality of connector pins provided in the fourth connector may be n (n<m). As shown in FIG. 3D, the wiring patterns 305 are wired so as to absorb the difference between the number of the plurality of connector pins provided in the third connector and the number of the plurality of connector pins provided in the fourth connector. As shown in FIG. 3D, the wiring patterns 305 include wires that branch out from one into k so as to connect k connector pins provided in the third connector (k>1) and one connector pin provided in the fourth connector. The amount of current (rated current value) that can flow through one connector pin among the k connector pins provided in the third connector may be 1/k of the amount of current (rated current value) that can flow through one connector pin provided in the fourth connector. The interface difference between the plurality of connectors may be absorbed in this manner. The third connector may be a DIP-type connector, or may be a surface-mount-type connector. Furthermore, only the third connector may be a surface-mount-type electrical component mounted on the third board. Furthermore, surface-mount-type electrical components mounted on the third board may be electrical components that are not likely to undergo dielectric breakdown. Surface-mount-type electrical components mounted on the third board may be passive elements. Note that surface-mount-type electrical components mounted on the first board include active elements. Active elements are likely to undergo dielectric breakdown. In the present embodiment, however, as a surface-mount-type connector is mounted on the first substrate, active elements are not touched by the hands of a person who performs the mounting operation. Thus, active elements are not likely to undergo dielectric breakdown.

As shown in FIG. 1, the photosensitive drums 1 are one example of an image carrier. The charging devices 2 are one example of a charging unit that charges an image forming surface of the image carrier using a charging voltage. The exposure devices 3 are one example of a light irradiation unit that forms an electrostatic latent image by irradiating the image forming surface with light. The developing devices 4 are one example of a developing unit that forms a toner image by applying toner to the electrostatic latent image using a developing voltage and developing the electrostatic latent image. The primary transfer device 7 and the secondary transfer device 27 are one example of a transfer unit that transfers the toner image to a sheet using a transfer voltage. The power supply circuit 211$x$ and the power supply circuits 211$a$ to 211$d$ are one example of a power supply circuit that generates at least one of the charging voltage, developing voltage, and transfer voltage. Note that the main power supply board 230 is one example of a power supply board that supplies power to the power supply circuits 211$a$ to 211$d$.

Figure 8:
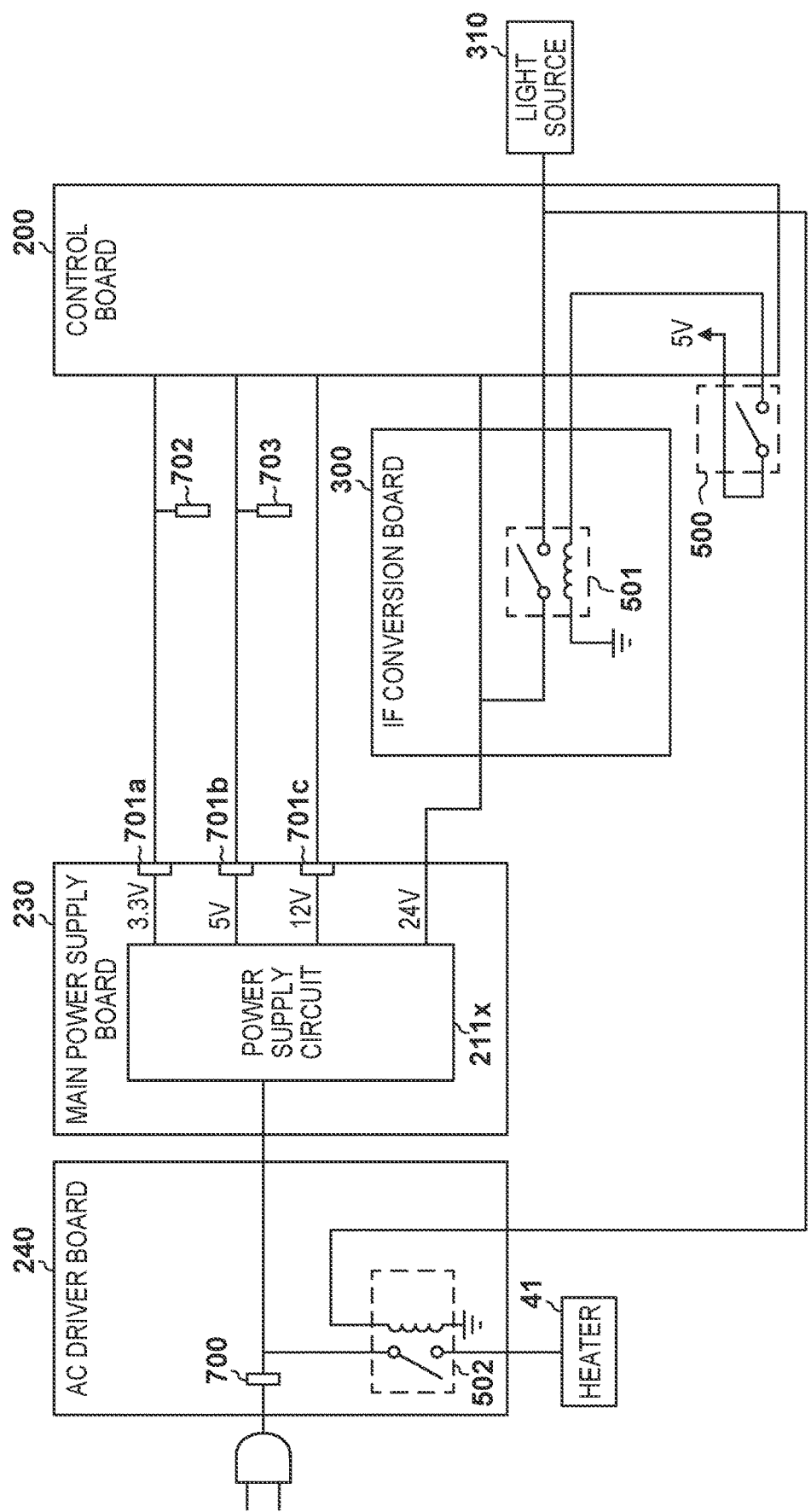
FIG. 8 is a circuit diagram of a control board, a main power supply board, and an IF conversion board according to another embodiment.

In the foregoing embodiment, the main power supply board 230 is realized by one board. However, an AC driver board 240 that applies the alternating-current voltage supplied from the commercial alternating-current power supply to the heater 41, and the main power supply board 230 that converts the alternating-current voltage supplied from the commercial alternating-current power supply into predetermined voltages, may be different boards. FIG. 8 shows an exemplary modification of a circuit diagram of the image forming apparatus 100 including the AC driver board 240. In this configuration also, the IF conversion board 300 is electrically connected between the main power supply board 230 and the control board 200. This can suppress the flow of the high current to the connector 302$e$ of the control board 200, even when the direct-current voltage of 24 V from the main power supply board 230 is supplied to the control board 200. Also, only surface-mount devices can be used as electronic components soldered to the control board 200.

In the exemplary modification shown in FIG. 8 also, the first connector is soldered to the main power supply board 230, and the second connector is soldered to the control board 200. The IF conversion board 300 functions as a relay board. That is, the third connector, which is connected to the first connector of the main power supply board 230 via the first power lines, is soldered to the IF conversion board 300. The fourth connector, which is connected to the second connector of the control board 200 via the second power lines, is soldered to the IF conversion board 300. The surface (solder side) to which the first connector is soldered on the main power supply board 230 is opposite to the surface (components side) to which the first connector is attached and mounted on the main power supply board 230. The surface (solder side) to which the second connector is soldered on the control board 200 is the surface (components side) to which the second connector is attached and mounted on the control board 200. Here, only surface-mount devices are used as electronic components soldered to the control board, including the second connector. The number of pins in the second connector is larger than the number of pins in the first connector. The number of pins in the fourth connector is larger than the number of pins in the third connector. The predetermined direct-current voltages generated by the main power supply board 230 are supplied to the control board 200 by way of the relay board.

Electronic components soldered to the main power supply board 230, including the first connector, do not include a surface-mount device. Electronic components soldered to the IF conversion board 300, including the third connector and the fourth connector, do not include a surface-mount device. A current that flows through one pin in the first connector may be higher than 6 [A].

An electronic component (e.g., the interlock circuit 501) for blocking the alternating-current voltage applied from the commercial alternating-current power supply to the heater 41 may be attached and mounted to the IF conversion board 300. An electronic component (e.g., the interlock circuit 501) for blocking power supply to the light sources 310 may be attached and mounted to the IF conversion board 300. An electronic component (e.g., the interlock circuit 501) for blocking power supply to the developing devices may be attached and mounted to the IF conversion board 300.

Other Embodiments

Embodiment(s) of the present invention can also be realized by a computer of a system or apparatus that reads out and executes computer executable instructions (e.g., one or more programs) recorded on a storage medium (which may also be referred to more fully as anon-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)TM), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-099797, filed May 24, 2018 which is hereby incorporated by reference herein in its entirety.

What is claimed is:

1. An image forming apparatus comprising:
   an image forming unit configured to form an image on a sheet;
   a fixing unit including a heater, and configured to fix the image on the sheet;
   a first board including a power supply circuit that generates a predetermined direct-current voltage from an alternating-current voltage supplied from a commercial alternating-current power supply, the power supply circuit configured to apply the alternating-current voltage to the heater;
   a second board configured to control the image forming unit based on the predetermined direct-current voltage generated by the power supply circuit;
   a first connector soldered to the first board;
   a second connector soldered to the second board; and
   a relay board to which a third connector and a fourth connector are soldered, the third connector being connected to the first connector of the first board via a first power line, the fourth connector being connected to the second connector of the second board via a second power line,
   wherein a surface to which the first connector is soldered on the first board is opposite to a surface to which the first connector is attached on the first board,
   a surface to which the second connector is soldered on the second board is a surface to which the second connector is attached on the second board,
   only surface-mount devices are used as electronic components soldered to the second board, including the second connector,
   the number of pins in the second connector is larger than the number of pins in the first connector,
   the number of pins in the fourth connector is larger than the number of pins in the third connector, and
   the predetermined direct-current voltage generated by the power supply circuit is supplied to the second board by way of the relay board.

2. The image forming apparatus according to claim 1, wherein
   electronic components soldered to the first board, including the first connector, do not include a surface-mount device.

3. The image forming apparatus according to claim 1, wherein
   electronic components soldered to the relay board, including the third connector and the fourth connector, do not include a surface-mount device.

4. The image forming apparatus according to claim 1, wherein
   a current that flows through one pin in the first connector is higher than 6 [A].

5. The image forming apparatus according to claim 1, wherein
   an electronic component for blocking the alternating-current voltage applied from the commercial alternating-current power supply to the heater is attached to the relay board.

6. The image forming apparatus according to claim 1, wherein
   the image forming unit includes
   a photosensitive member,
   a light source configured to expose the photosensitive member in order to form an electrostatic latent image on the photosensitive member, and
   a developing device configured to develop the electrostatic latent image on the photosensitive member, and
   an electronic component for blocking power supply to the light source is attached to the relay board.

7. The image forming apparatus according to claim 1, wherein
   the image forming unit includes
   a photosensitive member,
   a light source configured to expose the photosensitive member in order to form an electrostatic latent image on the photosensitive member, and
   a developing device configured to develop the electrostatic latent image on the photosensitive member, and
   an electronic component for blocking power supply to the developing device is attached to the relay board.

8. An image forming apparatus comprising:
   an image forming unit configured to form an image on a sheet;
   a fixing unit including a heater, and configured to fix the image on the sheet;
   an AC driver board configured to apply an alternating-current voltage supplied from a commercial alternating-current power supply to the heater;
   a power supply board configured to generate a predetermined direct-current voltage from the alternating-current voltage;
   a control board configured to control the image forming unit based on the predetermined direct-current voltage generated by the power supply board;
   a first connector soldered to the power supply board;
   a second connector soldered to the control board; and
   a relay board to which a third connector and a fourth connector are soldered, the third connector being connected to the first connector of the power supply board via a first power line, the fourth connector being connected to the second connector of the control board via a second power line,
   wherein a surface to which the first connector is soldered on the power supply board is opposite to a surface to which the first connector is attached on the power supply board,
   a surface to which the second connector is soldered on the control board is a surface to which the second connector is attached on the control board,
   only surface-mount devices are used as electronic components soldered to the control board, including the second connector,
   the number of pins in the second connector is larger than the number of pins in the first connector, the number of pins in the fourth connector is larger than the number of pins in the third connector, and the predetermined direct-current voltage generated by the power supply board is supplied to the control board by way of the relay board.

9. The image forming apparatus according to claim 8, wherein electronic components soldered to the power supply board, including the first connector, do not include a surface-mount device.

10. The image forming apparatus according to claim 8, wherein electronic components soldered to the relay board, including the third connector and the fourth connector, do not include a surface-mount device.

11. The image forming apparatus according to claim 8, wherein a current that flows through one pin in the first connector is higher than 6 [A].

12. The image forming apparatus according to claim 8, wherein an electronic component for blocking the alternating-current voltage applied from the commercial alternating-current power supply to the heater is attached to the relay board.

13. The image forming apparatus according to claim 8, wherein the image forming unit includes a photosensitive member, a light source configured to expose the photosensitive member in order to form an electrostatic latent image on the photosensitive member, and a developing device configured to develop the electrostatic latent image on the photosensitive member, and an electronic component for blocking power supply to the light source is attached to the relay board.

14. The image forming apparatus according to claim 8, wherein the image forming unit includes a photosensitive member, a light source configured to expose the photosensitive member in order to form an electrostatic latent image on the photosensitive member, and a developing device configured to develop the electrostatic latent image on the photosensitive member, and an electronic component for blocking power supply to the developing device is attached to the relay board.

* * * * *